(12) United States Patent
Dramé et al.

(10) Patent No.: US 9,810,741 B2
(45) Date of Patent: Nov. 7, 2017

(54) ARC-FAULT AND GROUND FAULT INTERRUPTER USING A SINGLE GROUND FAULT SENSOR AND SINGLE ADC

(71) Applicant: SCHNEIDER ELECTRIC USA, INC., Schaumburg, IL (US)

(72) Inventors: Issa Vignon Dramé, West Allis, WI (US); Randall James Gass, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 108 days.

(21) Appl. No.: 14/911,685

(22) PCT Filed: Sep. 13, 2013

(86) PCT No.: PCT/US2013/059618
§ 371 (c)(1),
(2) Date: Feb. 11, 2016

(87) PCT Pub. No.: WO2015/038140
PCT Pub. Date: Mar. 19, 2015

(65) Prior Publication Data
US 2016/0202321 A1    Jul. 14, 2016

(51) Int. Cl.
*H02G 3/16*    (2006.01)
*G01R 31/327*    (2006.01)
(Continued)

(52) U.S. Cl.
CPC ....... *G01R 31/3277* (2013.01); *G01R 31/025* (2013.01); *H02H 3/093* (2013.01);
(Continued)

(58) Field of Classification Search
CPC  G01R 31/3277; G01R 31/25; G01R 19/2509; G01R 19/2513; H02H 3/16; H02H 3/167; H02H 3/093
See application file for complete search history.

(56) References Cited

U.S. PATENT DOCUMENTS 5,889,643 A    3/1999 Elms
6,414,829 B1    7/2002 Haun et al.
(Continued)

OTHER PUBLICATIONS

EP Search Report for EP Application No. 13893402.1 dated Apr. 28, 2017.
(Continued)

*Primary Examiner* — Julian Huffman
*Assistant Examiner* — Michael Konczal
(74) *Attorney, Agent, or Firm* — Locke Lord LLP (57) ABSTRACT

Sampling for arc-fault detection, ground-fault detection, and grounded-neutral fault detection uses a single analog-to-digital converter (ADC). The arc-fault and ground-fault sampling occurs at regular sampling periods that are relatively short com pared to the time between them, thus allowing grounded-neutral fault sampling to occur before and/or after one of these sampling periods. A predefined event may be used to ensure the grounded-neutral fault sampling occurs immediately before and/or after one of the periodic sampling periods. The predefined event may be the expiration of a timer or the time for a sinusoidal signal in a ground fault sense circuit to make a predefined number of zero-crossings. This avoids interference between the arc-fault sampling, the ground-fault sampling and grounded-neutral fault sampling, allowing a single ADC to perform all samplings concurrently. The timing of the predefined event may be periodically reset to compensate for any changes due to temperature and/or over time.

20 Claims, 4 Drawing Sheets (51) Int. Cl.
    *G01R 31/02*     (2006.01)
    *H02H 3/16*     (2006.01)
    *H02H 3/093*     (2006.01)
    *G01R 19/25*     (2006.01)

(52) U.S. Cl.
    CPC .............. *H02H 3/16* (2013.01); *H02H 3/167* (2013.01); *G01R 19/2509* (2013.01); *G01R 19/2513* (2013.01)

(56) References Cited

U.S. PATENT DOCUMENTS

| | | | |
|---|---|---|---|
| 6,532,424 | B1 | 3/2003 | Haun et al. |
| 7,193,827 | B2 * | 3/2007 | Reid .................... G01R 31/025 324/684 |
| 7,944,654 | B2 * | 5/2011 | Scott .................... H02H 1/0015 361/42 |
| 2005/0083616 | A1 | 4/2005 | Reid et al. |
| 2009/0198459 | A1 | 8/2009 | Biac et al. |
| 2010/0118451 | A1 | 5/2010 | Scott et al. |
| 2012/0089266 | A1 | 4/2012 | Tomimbang et al. |
| 2012/0154972 | A1 | 6/2012 | McMahon et al. |

OTHER PUBLICATIONS

Young, PCT Search Report for PCT Application No. PCT/US2013/059618 dated Feb. 21, 2014.

\* cited by examiner

ARC-FAULT AND GROUND FAULT INTERRUPTER USING A SINGLE GROUND FAULT SENSOR AND SINGLE ADC

FIELD OF INVENTION

The embodiments disclosed herein relate generally to methods and systems for protecting against ground faults and arc-faults, and particularly to a method and system for protecting against ground faults and arc-faults that employ a common sensor and a single analog-to-digital converter (ADC) while using the same detection interval to detect such ground faults and arc-faults.

BACKGROUND OF INVENTION

Circuit breakers and ground-fault circuit interrupters (GFCIs) are generally well known in the art. A GFCI prevents shock or electrocution from a ground-fault, which is an unintended conductive path between an ungrounded current carrying conductor and earth ground that can occur, for example, when a plugged-in electrical appliance is dropped into a sink, pool, pond, puddle or hot tub. The GFCI cuts off power to the downstream circuits when it detects an imbalance in the load current (i.e., outgoing current different from returning current) that exceeds the allowable amount of ground fault leakage current. The leakage current path to ground may include the grounded metal case of an appliance or a person in some instances.

GFCIs can also protect against grounded-neutral faults. Unlike ground-faults, a grounded-neutral fault is a low impedance path between a ground wire and a neutral wire and occurs in situations where the neutral conductor is touching the ground conductor used for grounding equipment enclosures and structures. Ground fault current carried on the ground conductor has a return path that splits between the ground conductor and the neutral conductor. The ground fault current returning through the neutral conductor cancels out part of the existing ground fault signal, which desensitizes the ground fault detection circuit and can result in dangerously high ground fault currents appearing in the leakage path.

Presently available GFCI technology frequently uses a sense circuit having a differential current transformer and a single ADC to monitor for both ground-faults and grounded-neutral faults. Ground-faults are often detected by comparing the current in the sense circuit on the secondary side of the transformer to a reference value during a first time interval using the ADC. Grounded-neutral faults are often detected by monitoring the shorted primary circuit impedance reflected back on to the secondary of the transformer. One method for monitoring for grounded-neutral faults is by injecting current into the sense circuit during a second time interval to produce a decaying sinusoidal signal in the sense circuit. The amplitude of the decaying sinusoidal signal is measured during this interval by the ADC and the measured amplitude may then be used to determine the presence of grounded-neutral faults.

Recently, arc-fault circuit interrupters (AFCIs) have begun to be required in new home and building constructions. Arc-faults are intermittent faults that can be caused, for instance, by worn or damaged insulation, loose connections, broken conductors, and the like. Because of their intermittence, arc-faults do not generate sustained currents of sufficient magnitude to readily trip a conventional thermal-magnetic circuit interrupter. Inputs such as band-pass filters, line current sensors, and voltage sensors must be sampled at regular time periods in order to implement arc-fault detection algorithms.

Attempts to integrate arc-fault protection and ground fault protection in a dual-function ground fault and arc-fault circuit breaker device have met with mixed results. Note that the term "ground fault" (without a hyphen) as used in the phrase "ground fault protection" or "dual-function ground fault and arc-fault protection" may refer to both a "ground-fault" and a "grounded-neutral fault." In general, ground-fault sampling and grounded-neutral fault sampling occur during separate portions of a fault detection interval, while arc-fault sampling occurs throughout the fault detection interval. This can create a conflict because arc-fault sampling and grounded-neutral fault sampling use some of the same resources.

Specifically, grounded-neutral fault detection requires the ADC to frequently sample the amplitude of the decaying sinusoidal signal during a portion of the fault detection interval. However, because the ADC is regularly dedicated for sampling arc-fault related inputs and signals, a resource conflict may arise with respect to the ADC during this portion of the detection interval. As a result, it has heretofore not been practical to perform both arc-fault detection and grounded-neutral fault detection concurrently using a single ADC due to the potential for mutual interference. Adding an additional ADC, on the other hand, would increase the overall complexity and cost of the circuit breaker device.

Accordingly, what is needed is an efficient and cost-effective way to integrate arc-fault detection and ground fault detection in a single circuit breaker device. More specifically, what is needed is a way to perform arc-fault sampling and grounded-neutral fault sampling in the same sampling interval using a single ADC without creating mutual interference.

SUMMARY OF THE INVENTION

The disclosed embodiments provide a method and system in a circuit breaker device for performing arc-fault detection, ground-fault detection and grounded-neutral fault detection in a common detection interval using a single ADC while avoiding mutual interference. In general, the disclosed embodiments schedule the use of the ADC during the common detection interval so that the sampling required for the grounded-neutral fault detection takes place during a time when no arc-fault sampling occurs. Arc-fault sampling typically begins at or near the start of line voltage half cycle and occurs at periodic and known sampling durations that are relatively short compared to the time in between the arc-fault sampling periods. The sampling for the grounded-neutral faults may therefore be scheduled to take place before and/or after a specific one of the periodic and known arc-fault sampling periods to avoid mutual interference.

In general, any technique may be used to implement the scheduling of the grounded-neutral fault sampling, including a timer, the occurrence of certain predefined events, and the like. In some embodiments, scheduling of the grounded-neutral fault sampling may be implemented based on an event such as a predefined number of zero-crossings made by a decaying sinusoidal signal injected in the ground fault sense circuit. The number of zero-crossings used may be any suitable number for a particular implementation, such as from 1-50, for example. In some embodiments, the predefined number of zero-crossings may be a number, such as 13, that allows sufficient time for the peak-to-peak voltage of the decaying sinusoidal signal to fall to within the input range of the particular ADC being used.

To ensure the predefined number zero-crossing occurs on or near one of the periodic and known arc-fault sampling periods, the decaying sinusoidal signal may be delayed by an appropriate delay time. In some embodiments, the appropriate delay time may be determined based on the periodic and known arc-fault sampling periods. These periodic arc-fault sampling periods occur at known intervals that typically begin a short time after a supply line voltage zero-crossing, each sampling period lasting a known duration. The timing of the arc-fault sampling periods may then be used to calculate a delay time that ensures the predefined number zero-crossing occur on or near one of the arc-fault sampling periods.

In some embodiments, the time it takes for the decaying sinusoidal signal to make the predefined number zero-crossing may be re-measured from time to time in order to compensate for any changes that may have occurred in the ground fault sense circuit due to temperature and/or over time.

In general, in one aspect, the embodiments disclosed herein relate to a method of performing arc-fault sampling, ground-fault sampling, and grounded-neutral fault sampling in a circuit breaker device. The method comprises performing the arc-fault sampling during a plurality of arc-fault sampling periods, the arc-fault sampling periods occurring at regular intervals and each arc-fault sampling period lasting a fixed duration that is shorter than the time in between consecutive arc-fault sampling periods. The method further comprises monitoring for an occurrence of a predefined event in the circuit breaker device, the predefined event being timed to occur coincident with one of the plurality of arc-fault sampling periods, and performing the grounded-neutral fault sampling near the occurrence of the predefined event such that the grounded-neutral fault sampling is performed between said one of the plurality of arc-fault sampling periods and an immediately adjacent arc-fault sampling period. The arc-fault sampling, ground-fault sampling, and the grounded-neutral fault sampling may then be performed during a common detection interval.

In general, in another aspect, the embodiments disclosed herein relate to a system for performing arc-fault sampling, ground-fault sampling, and grounded-neutral fault sampling in an circuit breaker device. The system comprises a single system controller programmed to perform the arc-fault sampling, ground-fault sampling, and the grounded-neutral fault sampling during a common detection interval, a ground fault sense circuit connected to the system controller and configured to provide ground-fault sensor input and grounded-neutral fault sensor input to the system controller for performing the ground-fault sampling and the grounded-neutral sampling, and an arc-fault sense circuit connected to the system controller and configured to provide arc-fault sensor input to the system controller for the performing arc-fault sampling. The single system controller is configured to monitor for an occurrence of a predefined event in the circuit breaker device and perform the grounded-neutral fault sampling near the occurrence of the predefined event such that the grounded-neutral fault sampling is performed between one of a plurality of arc-fault sampling periods and an immediately adjacent arc-fault sampling period.

In general, in yet another aspect, the embodiments disclosed herein relate to a controller in a circuit breaker device configured to perform arc-fault sampling and grounded-neutral fault sampling. The controller comprises an analog-to-digital converter module (ADC) having a single input and a single output, the ADC configured to receive arc-fault sensor signals, ground-fault sensor signals, and a grounded-neutral fault sensor signal, the grounded-neutral fault sensor signal including a decaying sinusoidal signal, a comparator module configured to receive the grounded-neutral fault sensor signal and to detect zero-crossings made by the decaying sinusoidal signal, an input capture module configured to receive an indication of a zero-crossing detected by the comparator module and capture a timestamp for the zero-crossing, and an output compare module configured to initiate the decaying sinusoidal signal received by the ADC and the comparator. The controller is configured to operate the output compare module to initiate the decaying sinusoidal signal, operate the ADC to receive the decaying sinusoidal signal, operate the comparator module to detect zero-crossings made by the decaying sinusoidal signal, and operate the input capture module to obtain a timestamp for a zero-crossing. The controller is further configured to monitor for a predefined zero-crossing and perform the grounded-neutral fault sampling predefined zero-crossing, the predefined zero-crossing occurring coincident in time with one of a plurality of arc-fault sampling periods such that the grounded-neutral fault sampling is performed between said one of the plurality of arc-fault sampling periods and an immediately adjacent arc-fault sampling period, wherein the arc-fault sampling, grounded-fault sampling, and the grounded-neutral fault sampling are performed during a shared detection interval.

The foregoing and other aspects of the disclosed embodiments will become more apparent from the following detailed description and the drawings.

DETAILED DESCRIPTION OF DISCLOSED EMBODIMENTS

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

As indicated above, the disclosed embodiments relate to a circuit breaker method and system for performing both arc-fault detection, ground-fault detection and grounded-neutral fault detection while avoiding mutual interference or resource conflicts. In general, the disclosed embodiments are able to perform the detections by scheduling the sampling required for the grounded-neutral fault detection to occur during a time when no sampling occurs for the arc-fault detection. This approach allows the disclosed embodiments to provide both UL 1699 Combination Arc-fault and UL 943 Ground Fault protection using one microcontroller and a single ADC.

Figure 1:
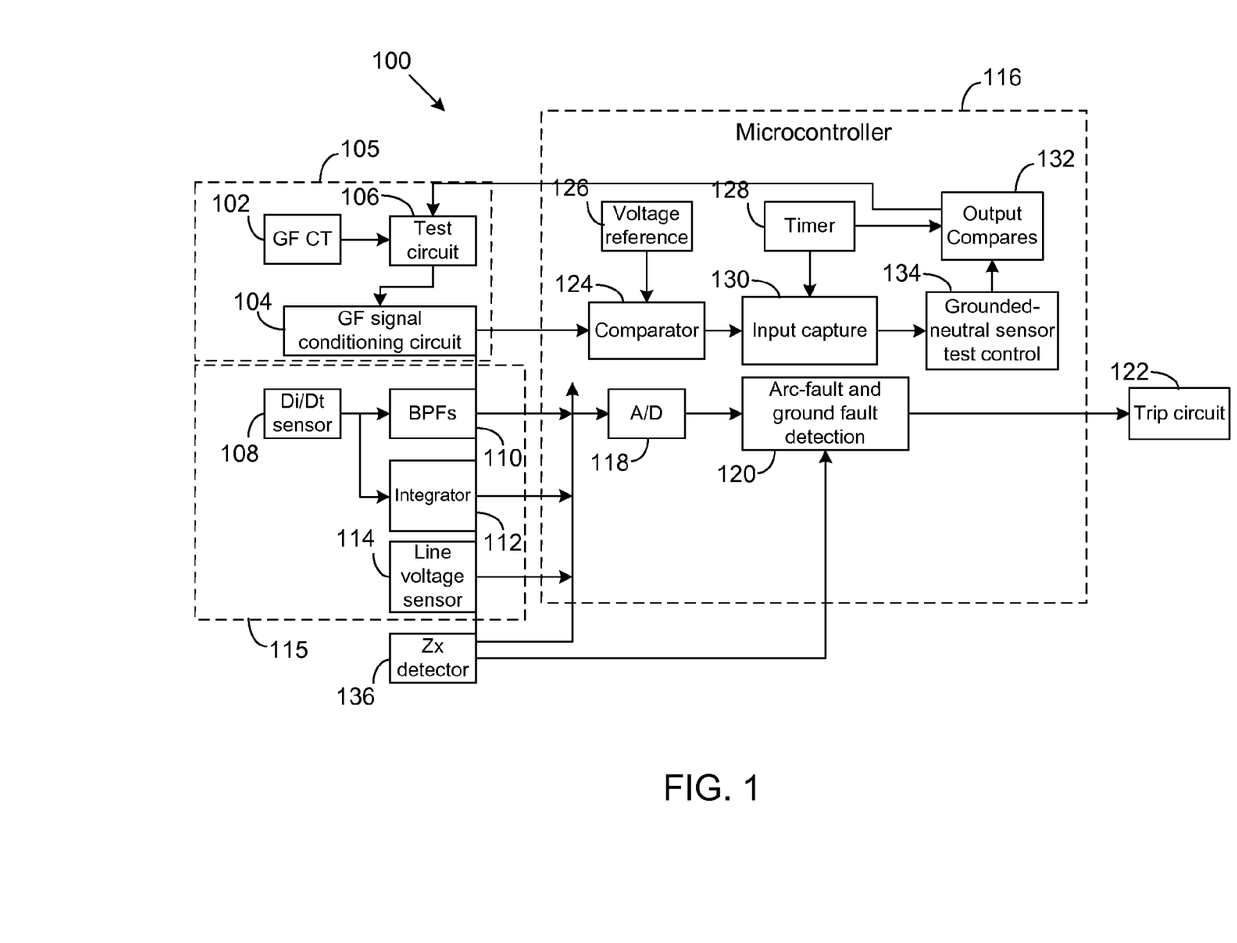
FIG. 1 illustrates an exemplary block diagram for performing arc-fault detection, ground-fault detection and grounded-neutral fault detection in accordance with the embodiments disclosed herein.

Referring now to FIG. 1, a block diagram of a microcontroller-based system 100 is shown that may be used as an interruption circuit in a circuit breaker device. In accordance with the disclosed embodiments, the system 100 is capable of detecting both ground faults and arc-faults in the same detection interval without mutual interference or resource conflicts. The system 100 is able to avoid mutual interference by scheduling the sampling for the grounded-neutral faults to occur before and/or after an arc-fault sampling period. Such a system 100 may be employed in any suitable dual-function circuit breaker device capable of providing ground fault and arc-fault protection known to those having ordinary skill in the art.

In some embodiments, the system 100 is able to schedule the grounded-neutral fault sampling around the arc-fault sampling because the timing of the arc-fault sampling periods is typically known and therefore predictable. For example, in most embodiments, the arc-fault sampling periods are timed to occur periodically at predefined time intervals beginning from the supply line zero-crossing. The grounded-neutral sampling may then be performed immediately before and/or immediately after one of these arc-fault sampling periods. And because the duration of each arc-fault sampling period is also known and usually much shorter than the time in between the sampling periods, there is ample time for the system 100 to perform the grounded-neutral fault sampling in between the arc-fault sampling periods.

As can be seen in the exemplary embodiment of FIG. 1, the system 100 may be composed of a number of functional components, represented here by the different blocks. For example, the system 100 may include a ground fault current transformer 102, a ground fault signal conditioning circuit 104, and a test circuit 106 may be controlled to provide a load or burden and a step signal. These components together form a ground fault sense circuit 105 when arranged as shown. Also present are a current sensor 108, one or more bandpass filters 110, an integrator 112, and a line voltage sensor 114. These components together form an arc-fault sense circuit 115 when arranged as shown.

The use of the foregoing components in grounded-neutral and arc-fault detection is well known in the art and therefore only a high-level description of their specific functions will be provided below. It should also be noted that ground-fault detection is assumed throughout this description to occur in a separate detection interval from arc-fault detection and grounded-neutral fault detection and therefore no separate description of such ground-fault detection is provided. For information regarding such ground-fault detection, reference may be made to U.S. Pat. No. 7,193,827, which is incorporated by reference.

A microcontroller 116 in the system 100 receives the inputs from the ground fault signal conditioning circuit 104, bandpass filters 110, integrator 112, and line voltage sensor 114. The microcontroller 116 converts these inputs from analog to digital signals so that they may be processed by the microcontroller 116 to detect ground faults and arc-faults in accordance with the disclosed embodiments. Such a microcontroller 116 may be any suitable microcontroller known to those having ordinary skill in the art, including a PIC24FJ32GA002 or similar microcontroller from Microchip Technology, Inc., a digital signal processor (DSP), an ASIC device, and the like.

In most embodiments, the microcontroller 116 advantageously uses only a single internal ADC 118 to receive and convert the inputs from the ground fault signal conditioning circuit 104, bandpass filters 110, integrator 112, and line voltage sensor 114. And the particular ADC 118 used herein is a type that is capable of handling only a single input at a time. The digitized signals from the ADC 118 are then provided to an arc-fault and ground fault detection unit 120 in the microcontroller 116 for further processing. This arc-fault and ground fault detection unit 120 operates to activate a current interrupt or trip circuit 122 if an arc-fault, ground-fault, or grounded-neutral fault is detected in accordance with the embodiments disclosed herein.

Other components that may be present include a comparator 124 in the microcontroller 116 that receives the input from the ground fault signal conditioning circuit 104 and compares it to a programmable voltage reference 126 (Vref) for purposes of zero-crossing detection. As well, the microcontroller 116 may include at least one counter or timer 128 for counting down time as needed, an input capture module 130 for providing timestamps as triggered by the comparator 124, one or more output compare modules 132 for automating the ground fault sensor testing, and a grounded-neutral sensor test control 134 for controlling the timing of a step signal that may be applied to the ground fault signal conditioning circuit 104 via the test circuit 106. Finally, a line voltage zero-crossing detector 136 provides input to the microcontroller 116 to detect zero-crossings made by the supply line (not expressly shown).

Figure 2:
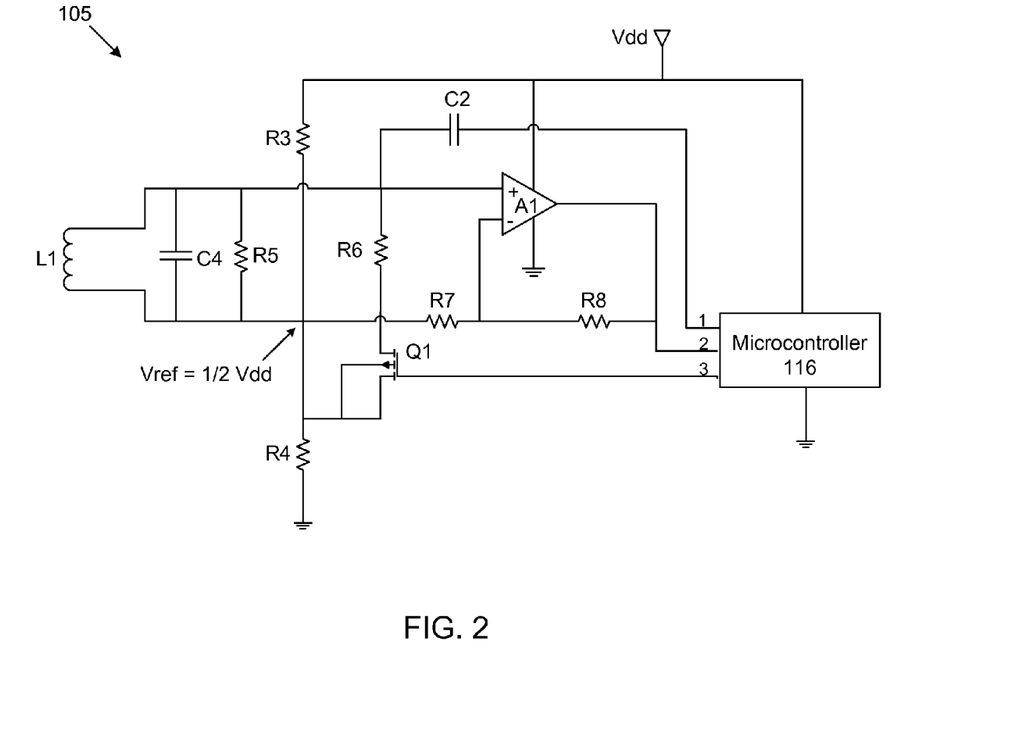
FIG. 2 illustrates an exemplary circuit diagram for performing ground-fault detection and grounded-neutral fault detection in accordance with the embodiments disclosed herein.

FIG. 2 depicts the ground fault sense circuit 105 in more detail for one exemplary implementation of the disclosed embodiments. As can be seen in this implementation, the ground fault sense circuit 105 is composed of several discrete circuit elements that form the ground fault current transformer 102, the ground fault signal conditioning circuit 104, and the test circuit 106. Those having ordinary skill in the art will understand that it is possible to achieve equivalent or similar functionality using one or more integrated circuits instead of discrete circuit elements without departing from the scope of the disclosed embodiments.

In the implementation shown here, the ground fault current transformer 102 may include a ground fault sensor winding L1, which is typically coupled to the line conductor and neutral conductor (not expressly shown) of the supply line.

Capacitor C4, ground fault sensor winding L1, and resistor R5 form a resonant circuit that allows a step signal supplied to the ground fault sense circuit 105 to resonate with a certain amount of damping. Capacitor C2 provides this step signal for the ground fault sense circuit 105 when so controlled by the microcontroller 116. A mode select circuit composed of transistor Q1 and a load or burden resistor R6 may be provided for use during ground-fault detection. In some embodiments, the transistor Q1 may be an FET transistor that may be controlled by the microcontroller 116 to place the burden resistor R6 across the sensor winding L1 during ground-fault detection. These components together form the test circuit 106 when arranged as shown.

An amplifier A1 may also be present and may be connected to a pair of resistors R7 and R8 that are in turn connected to the microcontroller 116. A bias voltage resistive divider circuit may be formed by a pair of resistors R3 and R4 connected as shown to establish a circuit voltage equal to ½ of the system input voltage Vdd. These components together form the ground fault signal conditioning circuit 104 when arranged as shown.

In general operation, there are two detection processes that need to occur in real time during the same detection interval in the system 100 without mutual interference: arc-fault detection and grounded-neutral fault detection. For grounded-neutral fault detection, the microcontroller 116 typically measures the peak-to-peak voltage of a decaying sinusoidal signal in the ground fault sense circuit 105 during the detection interval. For arc-fault detection, the microcontroller 116 continuously and periodically samples the arc-fault sensor inputs in the arc-fault sense circuit 115 during the same detection interval. Ground-fault detection occurs during a separate portion of the detection interval from grounded-neutral fault detection and therefore is assumed to present no resource conflict or interference.

Figure 3:
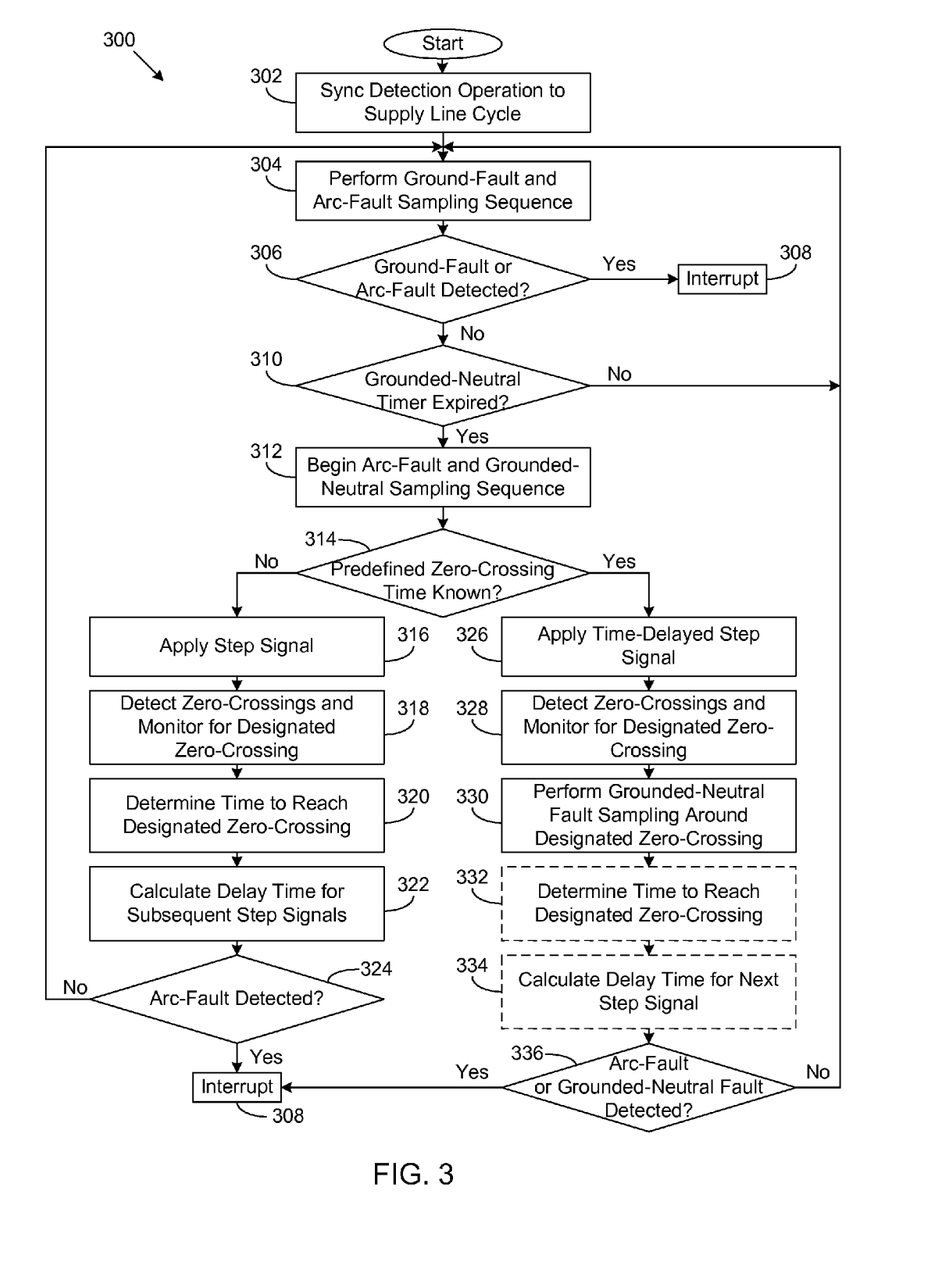
FIG. 3 illustrates an exemplary flow diagram for performing arc-fault detection, ground-fault detection and grounded-neutral fault detection in accordance with the embodiments disclosed herein.

FIG. 3 illustrates the operation of the system 100 via an exemplary flow diagram 300 in accordance with the embodiments disclosed herein. Note that although a number of individual blocks are shown in FIG. 3, those having ordinary skill in the art will understand that one or more of these blocks may be divided into several constituent blocks without departing from the scope of the disclosed embodiments. Similarly, two or more individual blocks may be combined into a single block without departing from the scope of the disclosed embodiments. Further, although the blocks are shown in a specific sequence, those having ordinary skill in the art will understand that one or more of these blocks may be performed out of sequence with one or more other blocks, or at the same time as one or more other blocks, without departing from the scope of the disclosed embodiments.

As can be seen in FIG. 3, upon starting up at block 302, the microcontroller 116 synchronizes its detection sequence to the supply line cycle. Specifically, the microcontroller 116 waits for a supply line voltage zero-crossing to occur, then synchronizes the detection sequence to that zero-crossing. At block 304, the microcontroller 116 performs arc-fault detection and ground-fault detection in a manner known to those having ordinary skill in the art. At block 306, the microcontroller 116 analyzes the results of the detection sequence at block 304 and determines whether a ground-fault or an arc-fault has been detected. If the determination at block 306 is yes, then the microcontroller 116 trips or otherwise interrupts the circuit at block 308.

If the determination at block 306 is yes, the microcontroller 116 makes a determination at block 310 as to whether a grounded-neutral detection delay timer has expired. This grounded-neutral detection delay timer ensures that sufficient time has been allotted to the microcontroller 116 to perform arc-fault detection and ground-fault detection in a manner known to those having ordinary skill in the art. If the determination at block 310 is no, then the microcontroller 116 continues the arc-fault and ground-fault detection process.

If the determination at block 310 is yes, then the microcontroller 116 begins the arc-fault and grounded-neutral fault detection process at block 312. In particular, the microcontroller 116 periodically samples the arc-fault sensor inputs needed for arc-fault detection during this portion of the detection interval, while also sampling the grounded-neutral sensor inputs during the portion of the detection interval.

As part of the grounded-neutral sampling, the microcontroller 116 makes a determination at block 314 whether it needs to determine the amount of time needed for predefined event to occur. In some embodiments, the predefined event is a decaying sinusoidal signal in the ground fault sense circuit 105 making a predefined number of zero-crossings. The time needed for this predefined event to occur is unknown when the microcontroller 116 first starts up because the resonant frequency of the ground fault sense circuit 105, and hence the time it takes for a decaying sinusoidal signal to make the predefined number of zero-crossings, has not yet been determined.

If the determination at block 314 is yes, then at block 316, the microcontroller 116 begins an initialization phase by turning off the burden control FET, then applying a step signal to the ground fault sense circuit 105 to generate an initial decaying sinusoidal signal in the sense circuit 105. The microcontroller 116 then detects the zero-crossings made by the decaying sinusoidal signal at block 318 and tracks or monitors for the final zero-crossing in a predefined number of zero-crossings. At block 320, the microcontroller determines (and stores) the time it took for the decaying sinusoidal signal to reach this designated zero-crossing. The predefined number of zero-crossings used may be any number that is suitable for a particular application, for example, from one to 50 zero-crossings.

In preferred embodiments, the predefined number of zero-crossings may be the number of zero-crossings that allows the peak-to-peak voltage of the decaying sinusoidal signal to fall to within the ADC input voltage range (e.g., 0V to 3V). This predefined number of zero-crossings may be 13 in some embodiments, although the sinusoidal signal's decay rate typically varies depending on the circuit components used, operating temperature, and the like, so the number of zero-crossings may be different in other embodiments. The use of multiple zero-crossings additionally allows for averaging of the zero-crossing frequency, although it can also be beneficial to use as few zero-crossings as possible to minimize the time used for grounded-neutral detection, as that is time taken away from ground-fault detection.

Once the time needed for the decaying sinusoidal signal to reach the designated zero-crossing has been determined, at block 322, the microcontroller 116 may calculate (and store) a delay time needed for delaying initiation of subsequent step signals. This delay time helps ensure that the decaying sinusoidal signals resulting from the subsequent step signals make the designated zero-crossing on or near an arc-fault sampling period (the timing for which is known).

Thereafter, at block 324, the microcontroller determines whether an arc-fault has been detected. If this determination is yes, then the microcontroller 116 trips or otherwise interrupts the circuit at block 308. If the determination is no, then the microcontroller 116 returns to block 304 and continues to perform ground-fault and arc-fault detection.

If the determination at block 314 is no, meaning the time needed for the decaying sinusoidal signal in the ground fault sense circuit 105 to make the predefined number of zero-crossings has already been determined, then the microcontroller 116 commences normal sampling operation at block 326. Specifically, the microcontroller 116 waits for an amount of time equal to the delay time calculated at block 322, then initiates the second (subsequent) sinusoidal signal. As explained earlier, this delay time ensures that the second (subsequent) sinusoidal signal will make the designated zero-crossing very near or coincident with one of the arc-fault sampling periods. At block 328, the microcontroller 116 detects the zero-crossings made by the sinusoidal signal and monitors for the designated zero-crossing. The microcontroller 116 may then perform the grounded-neutral fault sampling at block 330 either before and/or after the designated zero-crossing occurs.

To take an example, in an embodiment where the predefined number of zero-crossings is 13, the microcontroller 116 may perform the peak-to-peak measurement for the grounded-neutral fault sampling between the 12th and 13th zero-crossing and/or between the 13th and 14th zero-crossing. In this way, the microcontroller 116 is virtually assured that the ADC 118 will not already be busy taking an arc-fault sample at the same time.

In some embodiments, as optional steps after performing the grounded-neutral fault sampling at block 330, the microcontroller 116 may again determine the time it takes for the sinusoidal signal to reach the designated zero crossing at block 332, and may calculate (and store) an appropriate delay time for delaying initiation of the next step signal at block 334. This helps ensure that the decaying sinusoidal signal resulting from the next step signal makes the designated zero-crossing on or near an arc-fault sampling period. These optional steps allow the microcontroller 116 to continuously update the time that it takes the sinusoidal signal to reach the designated zero-crossing and the step signal delay time, not just at startup when the designated zero-crossing time is unknown or after some periodic reset interval.

Finally, at block 336, the microcontroller determines whether an arc-fault or grounded-neutral fault has been detected. If this determination is yes, then the microcontroller 116 trips or otherwise interrupts the circuit at block 308. If the determination is no, then the microcontroller 116 returns to block 304 and continues to perform ground-fault and arc-fault detection.

In some embodiments, the resonant frequency of the ground fault sense circuit 105 may change, and hence the time needed for the decaying sinusoidal signal to make the predefined number of zero-crossings may change, with variations in the ambient temperature and/or with the passage of time. Any such changes may be compensated by regularly repeating the sampling initialization sequence in FIG. 3, for example, after a predefined duration of normal operation (e.g., every 200 ms, 300 ms, 400 ms, etc.), after a predefined number of sinusoidal signals have been initiated (e.g., 300, 400, 500, etc.), or the like. This allows the microcontroller 116 to compensate for any frequency shifts that may have occurred as a result of ambient temperature changes and/or with the passage of time.

Following now is a description of the operation of a specific system 100 implemented using a PIC24FJ32GA002 or similar microcontroller from Microchip Technology, Inc. Upon start-up, the microcontroller initializes its I/O ports, waits for a supply line voltage zero-crossing, then begins periodically sampling all fault sensor inputs, including ground-fault, grounded-neutral fault, and arc-fault sensor inputs using its ADC. In some embodiments, the microcontroller takes 32 samples per supply line half-cycle, resulting in periods of time where the ADC is occupied and unavailable. This process is usually not interrupted and the sampling period usually is not modified during normal sampling operation. A test timer may also be started at this time, 300 ms for example, to allocate enough time for the microcontroller to perform ground-fault sampling (and arc-fault sampling).

After the initial expiration of the test timer, the microcontroller programs a voltage reference (e.g., Vref_internal or Comparator Vref) to match the offset voltage of the ground fault sense circuit's sinusoidal signal relative to ground in preparation for switching from ground-fault detection to grounded-neutral detection, then waits for the next supply line voltage zero-crossing. Once that occurs, a timer peripheral TMR1 in the microcontroller separate from the test timer may be turned on, and several output compare modules, for example OC1 and OC2, may then be programmed to change the states of the microcontroller test control I/O pins when the timer peripheral TMR1 reaches certain predefined counts. Note that for grounded-neutral detection, the burden transistor Q1 is turned off by OC1 and then turned back on. Once Q1 is turned back on, OC1 is turned off. But before OC1 is turned off, an I/O pin is programmed to keep the transistor Q1 on during the ground-fault detection interval.

In a typical operation, when the timer peripheral TMR1 reaches a certain predefined count, output compare module OC1 may control an I/O pin to turn off transistor Q1, causing burden resistor R6 to be removed from the ground fault sense circuit 105 for purposes of beginning grounded-neutral fault detection. When the timer peripheral TMR1 reaches another predefined count, output compare module OC1 turns on transistor Q1, thus applying the burden resistor R6 to the ground fault sense circuit 105 for ground-fault detection.

Output compare module OC2 in the microcontroller may control an I/O pin that is connected to capacitor C2 that is in turn connected to the ground fault sense circuit 105. When the timer peripheral TMR1 reaches a predefined count, the output compare module OC2 toggles the I/O pin to cause this capacitor C2 to dump a charge into the ground fault sense circuit 105. This charge dump initiates a step signal that oscillates and attenuates in the ground fault sense circuit 105 at a certain frequency, creating a decaying sinusoidal signal, the voltage amplitude of which may then be measured for grounded-neutral fault detection. When another charge dump is needed, the microcontroller toggles logic level states, high-to-low or low-to-high, to dump another charge into the circuit. This logic state transition creates an initial positive or negative pulse in the ground fault sense circuit 105 (i.e., a low-to-high transition creates a positive pulse and vice versa).

At the same (or nearly the same) time the step signal is initiated, a comparator C1 in the microcontroller is turned on and used to detect zero-crossings by the decaying sinusoidal signal in the ground fault sense circuit 105. An input capture module IC1 in the microcontroller is configured to capture the timestamps of the zero-crossings as triggered by comparator C1. In some embodiments, the input capture module IC1 may be configured to capture the timestamps of every other zero-crossing, starting with the first one, until the designated number of zero-crossings has occurred. For example, in an embodiment where the designated number of zero-crossings is 13, seven timestamps may be captured for a total of 13 zero-crossings. The microcontroller may then turn off the input capture module IC1 after the 13th zero-crossing (or after the seventh timestamp).

Now that the time it takes for the sinusoidal signal to make the predefined number of zero-crossings is determined, the microcontroller may use this time to calculate the delay time needed for controlling the start of subsequent sinusoidal signals to ensure that the designated zero-crossing will occur at or near one of the arc-fault sampling periods (which is known). The microcontroller may then schedule grounded-neutral fault sampling to occur immediately before and/or immediately after the designated zero-crossing.

After the grounded-neutral fault detection is done, based on a predefined count by the timer TMR1, compare module OC1 asserts the I/O pin to turn transistor Q1 back on, thus reapplying the burden resistor R6 across the ground fault sense circuit 105 for ground-fault detection.

Figure 4A:
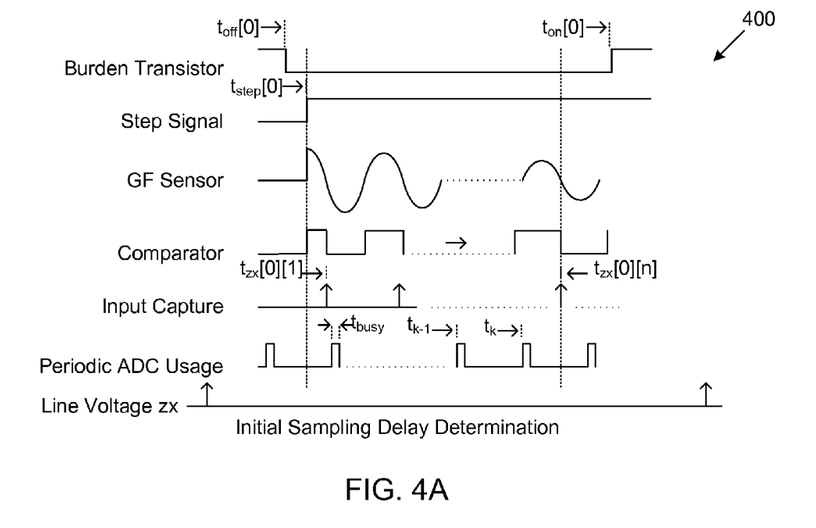
FIGS. 4A and 4B illustrate exemplary timing diagrams for performing arc-fault detection and grounded-neutral fault detection in accordance with the embodiments disclosed herein.
Figure 4B:
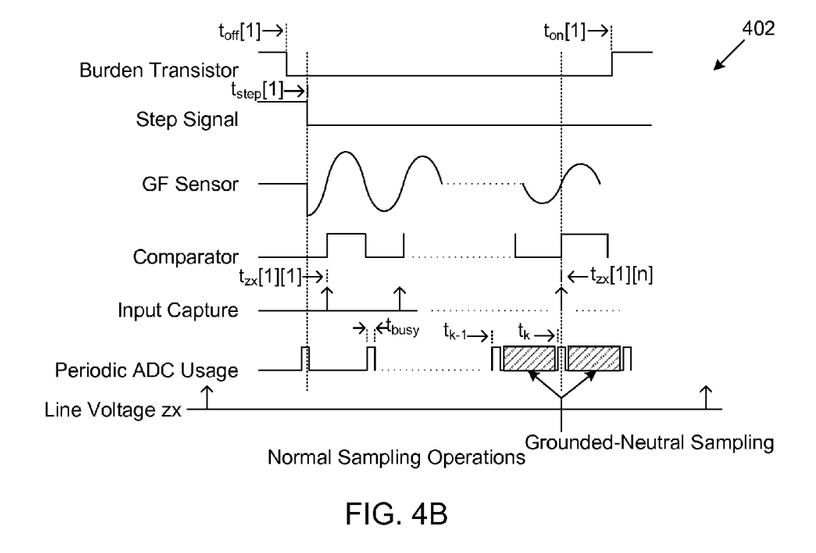

FIGS. 4A and 4B illustrate exemplary timing diagrams for the system 100. The timing diagram in FIG. 4A generally shows the sampling initialization sequence of the system 100 in which the time it takes for the sinusoidal signal to make the predefined number of zero-crossings is determined, while the timing diagram in FIG. 4B generally shows the normal sampling operation of the system 100. In these timing diagrams, $t_{off}$ starts the period when transistor Q1 is turned off and the burden resistor R6 is removed from the ground fault sense circuit 105, while $t_{on}$ starts the period when transistor Q1 is turned on and the burden resistor R6 is applied to the ground fault sense circuit 105 (i.e., during ground-fault detection). In addition, $t_{step}$ is the delay time used to schedule the insertion of the step signal that leads to the decaying sinusoidal signal and may be set initially to any suitable predefined value prior to being calculated. Also, $t_{zx}$ represents the instances in time when the decaying sinusoidal signal makes a zero-crossing, and $t_k$ represents the instances in time when an arc-fault sampling period begins. Finally, $t_{busy}$ represents the length of the arc-fault sampling period during which the ADC is busy and hence unavailable to sample the grounded-neutral fault inputs. The variable m represents a particular iteration of the detection interval and the variable n represents a particular zero-crossing by the decaying sinusoidal signal within the detection interval.

For ease of reference, the timing diagrams in FIGS. 4A and 4B will be described with reference to a PIC24FJ32GA002 based system 100. As can be seen in FIG. 4A, during the initialization phase (i.e., m=0), when the timer TMR1 reaches a predefined count as represented by $t_{off}$, the microcontroller causes transistor Q1 to remove the burden resistor R6 from the ground fault sense circuit 105. When the timer TMR1 reaches another predefined count reflecting the value of $t_{step}$, the microcontroller causes capacitor C2 to dump a charge into the ground fault sense circuit 105. This charge dump generates a decaying sinusoidal signal in the ground fault sense circuit 105 that may be sampled for grounded-neutral fault detection, as indicated by the line labeled "GF Sensor."

At the same (or nearly the same) time the sinusoidal signal is generated, the comparator C1 in the microcontroller is turned on and used to detect a predefined number of zero-crossings made by the decaying sinusoidal signal, as indicated by the line labeled "Comparator." Each time a zero-crossing is detected (or every other time, depending on the implementation), the input capture module IC1 captures the timestamp of the zero-crossing, as indicated by the line labeled "Input Capture." Note that the final zero-crossing in the predefined number of zero-crossings does not occur on or near an arc-fault sampling period during the initialization phase, as indicated by the line labeled "Periodic ADC Usage." However, by setting the step signal delay time $t_{step}$ appropriately, the designated zero-crossing may be ensured to occur near or coincident with an arc-fault sampling period during normal operation. In some embodiments, the step signal delay time $t_{step}$ may be calculated according to Equation 1 below, where $(t_{zx[m-1][n]} - t_{step[m-1]})$ is the time it takes for the sinusoidal signal to make the predefined number of zero-crossings:

$$t_{step[m]} = t_k - \tfrac{1}{2} t_{busy} - (t_{zx[m-1][n]} - t_{step[m-1]}), \text{ for } m>0 \quad \text{(Eq. 1)}$$

With the step signal delay time calculated, normal sampling operation may now begin, as depicted in FIG. 4B. This timing diagram is similar to the one in FIG. 4A except that the time it takes for the sinusoidal signal to make the predefined number of zero-crossings has now been determined and the step signal delay time $t_{step}$ has been set accordingly. The sinusoidal signal thus makes the designated zero-crossing near or coincident with an arc-fault sampling period, and the microcontroller is free to perform grounded-neutral fault sampling just before and/or just after that arc-fault sampling period, as the ADC is virtually guaranteed to be available then. This advantageous timing can be achieved, as mentioned earlier, because the arc-fault sampling periods occur regularly and periodically starting from a supply line zero-crossing, as indicated by the line labeled "Line Voltage zx."

Note in this embodiment that the step signal of FIG. 4B has the opposite polarity from the step signal of FIG. 4A due to the toggling the logic state of the I/O pin controlling capacitor C2 to generate the step signal, which results in a step signal having the opposite polarity from the previous step signal. It is of course possible to arrange for the step signals to have the same polarity in both figures without departing from the scope of the disclosed embodiments.

While the disclosed embodiments have been described with reference to one or more particular implementations, those skilled in the art will recognize that many changes may be made thereto without departing from the spirit and scope of the description.

For example, while grounded-neutral fault sampling has been described above with respect to the time it takes for a sinusoidal signal to make a predefined number of zero-crossings, those having ordinary skill in the art understand that alternative timing techniques may be used. Specifically, rather than using zero-crossings to time the start of arc-fault sampling and ground-fault sampling, the arc-fault sampling and ground-fault sampling may be based off a timer programmed to count down a predetermined amount of time. The grounded-neutral fault sampling may then be scheduled to occur around the arc-fault sampling using the same timer. The timer may be internal to the microcontroller, such as the peripheral timer TMR1 (see FIG. 3) or another peripheral timer in the microcontroller, or the timer may be an external timer operated in conjunction with the microcontroller.

As another example, instead of an internal ADC, an external ADC could be used with the microcontroller.

In addition, instead of using the ADC to sample the sinusoidal signal in real time, a peak detection circuit may be implemented whereby the sinusoidal signal charges a small capacitor through a diode and a resistor. Two instances of this circuit may be used, one for the positive peak of interest and one for the negative peak of interest. A switching element such as a transistor may be used to enable this circuit during the cycle of interest by allowing the capacitors to charge. The voltages can later be converted when the ADC is available, allowing the peak-to-peak voltage to be determined.

Further, rather than using the output compare modules, a timer could be programmed to expire for each event, such as turning the burden transistor on/off and initiating the step signal. In a corresponding interrupt request, appropriate I/O pin controls may then be performed to carry out the events. And instead of using an input capture module, the comparator may be configured to cause an interrupt request upon detecting a signal zero-crossing. The microcontroller itself may then retrieve the corresponding timestamp for the zero-crossing.

Accordingly, each of these embodiments and obvious variations thereof is contemplated as falling within the spirit and scope of the claimed invention, which is set forth in the following claims.

What is claimed is:

1. A method of performing arc-fault sampling, ground-fault sampling, and grounded-neutral fault sampling in a circuit breaker device, comprising:
    performing the arc-fault sampling during a plurality of arc-fault sampling periods, the arc-fault sampling periods occurring at regular intervals and each arc-fault sampling period lasting a fixed duration that is shorter than the time in between consecutive arc-fault sampling periods;
    monitoring for an occurrence of a predefined event in the circuit breaker device, the predefined event being timed to occur coincident with one of the plurality of arc-fault sampling periods; and
    performing the grounded-neutral fault sampling near the occurrence of the predefined event such that the grounded-neutral fault sampling is performed between said one of the plurality of arc-fault sampling periods and an immediately adjacent arc-fault sampling period;
    wherein the arc-fault sampling, ground-fault sampling, and the grounded-neutral fault sampling are performed during a common detection interval.

2. The method according to claim 1, further comprising calculating a delay time for the predefined event, the delay time ensuring that the predefined event occurs coincident in time with one of the plurality of arc-fault sampling periods.

3. The method according to claim 1, further comprising generating a sinusoidal signal in the circuit breaker device, wherein the predefined event is the final zero-crossing in a predefined number of zero-crossings made by the sinusoidal signal.

4. The method according to claim 1, wherein the predefined number of zero-crossings is any number between one and 50.

5. The method according to claim 1, wherein the grounded-neutral fault sampling is performed between said one of the plurality of arc-fault sampling periods and an immediately preceding arc-fault sampling period and between said one of the plurality of arc-fault sampling periods and an immediately following arc-fault sampling period.

6. The method according to claim 1, wherein the ground-fault sampling is performed in a different portion of the common detection interval from the grounded-neutral fault sampling.

7. The method according to claim 1, wherein the arc-fault sampling and the ground-fault sampling are based off a zero-crossing of a supply line voltage.

8. The method according to claim 1, wherein the arc-fault sampling and the ground-fault sampling are based off a timer programmed for a predetermined amount of time and the predefined event is timed to occur based off said timer.

9. A system for performing arc-fault sampling, ground-fault sampling, and grounded-neutral fault sampling in an circuit breaker device, comprising:
    a single system controller programmed to perform the arc-fault sampling, ground-fault sampling, and the grounded-neutral fault sampling during a common detection interval;
    a ground fault sense circuit connected to the system controller and configured to provide ground-fault sensor input and grounded-neutral fault sensor input to the system controller for performing the ground-fault sampling and the grounded-neutral sampling; and
    an arc-fault sense circuit connected to the system controller and configured to provide arc-fault sensor input to the system controller for the performing arc-fault sampling;
    wherein the single system controller is configured to monitor for an occurrence of a predefined event in the circuit breaker device and perform the grounded-neutral fault sampling near the occurrence of the predefined event such that the grounded-neutral fault sampling is performed between one of a plurality of arc-fault sampling periods and an immediately adjacent arc-fault sampling period.

10. The system according to claim 9, wherein the grounded-neutral fault sensor input includes a sinusoidal signal and the predefined event is the final zero-crossing in a predefined number of zero-crossings made by the sinusoidal signal.

11. The system according to claim 10, wherein the predefined number of zero-crossings is a number that allows a peak-to-peak voltage of the sinusoidal signal to decay to within a predefined voltage range.

12. The system according to claim 9, wherein the single system controller is further configured to calculate a delay time for the predefined event, the delay time ensuring that the predefined event occurs coincident in time with said one of the plurality of arc-fault sampling periods.

13. The system according to claim 9, wherein the single system controller is further configured to perform the grounded-neutral fault sampling between said one of the plurality of arc-fault sampling periods and an immediately preceding arc-fault sampling period and an immediately following arc-fault sampling period.

14. The system according to claim 9, wherein the single system controller performs the arc-fault sampling periods at a predefined time interval relative to each other and each arc-fault sampling period is performed for a fixed duration that is shorter than the predefined time interval.

15. The system according to claim 9, the circuit breaker device is connected to a supply line voltage and the single system controller is further configured to initiate the arc-fault sampling and the ground-fault sampling upon a zero-crossing of a supply line voltage.

16. A controller in a circuit breaker device configured to perform arc-fault sampling and grounded-neutral fault sampling, comprising:
    an analog-to-digital converter module (ADC) having a single input and a single output, the ADC configured to receive arc-fault sensor signals, ground-fault sensor signals, and a grounded-neutral fault sensor signal, the grounded-neutral fault sensor signal including a decaying sinusoidal signal;

a comparator module configured to receive the grounded-neutral fault sensor signal and to detect zero-crossings made by the decaying sinusoidal signal;

an input capture module configured to receive an indication of a zero-crossing detected by the comparator module and capture a timestamp for the zero-crossing; and an output compare module configured to initiate the decaying sinusoidal signal received by the ADC and the comparator;

the controller being configured to:

operate the output compare module to initiate the decaying sinusoidal signal;

operate the ADC to receive the decaying sinusoidal signal;

operate the comparator module to detect zero-crossings made by the decaying sinusoidal signal; and operate the input capture module to obtain a timestamp for a zero-crossing;

the controller being further configured to monitor for a predefined zero-crossing and perform the grounded-neutral fault sampling predefined zero-crossing, the predefined zero-crossing occurring coincident in time with one of a plurality of arc-fault sampling periods such that the grounded-neutral fault sampling is performed between said one of the plurality of arc-fault sampling periods and an immediately adjacent arc-fault sampling period;

wherein the arc-fault sampling, grounded-fault sampling, and the grounded-neutral fault sampling are performed during a shared detection interval.

17. The controller according to claim 16, further comprising an arc-fault and ground fault detection module operated by the controller to detect arc-faults and grounded-neutral faults based on the arc-fault sensor signals and the grounded-neutral fault sensor signal.

18. The controller according to claim 16, further comprising a grounded-neutral sensor test control module operated by the controller to calculate a delay time for the predefined zero-crossing, the delay time ensuring that the predefined zero-crossing occurs substantially coincident in time with said one of the plurality of arc-fault sampling periods.

19. The controller according to claim 18, further comprising a timer operable by the controller to count down the delay time and by the comparator module to detect zero-crossings made by the decaying sinusoidal signal.

20. The controller according to claim 16, further comprising a voltage reference programmed by the controller, the voltage reference allowing the comparator module to determine when the decaying sinusoidal signal has made a zero-crossing.

* * * * *